United States Patent
Lincot et al.

(10) Patent No.: US 7,713,759 B2
(45) Date of Patent: May 11, 2010

(54) METHOD FOR PRODUCING AN IMAGING DEVICE

(75) Inventors: Daniel Lincot, Antony (FR); Francois Mongellaz, Seyssins (FR); Renée Mongellaz, legal representative, Albertville (FR); Martine Mongellaz, legal representative, Frejus (FR); Hélène Herview, legal representative, Castries (FR)

(73) Assignees: Commissariat A l'Energie Atomique, Paris (FR); Centre National de la Recherche Scientifique, Paris Cedex (FR)

( * ) Notice: Subject to any disclaimer, the term of this patent is extended or adjusted under 35 U.S.C. 154(b) by 600 days.

(21) Appl. No.: 10/497,883

(22) PCT Filed: Dec. 9, 2002
(Under 37 CFR 1.47)

(86) PCT No.: PCT/FR02/04234

§ 371 (c)(1),
(2), (4) Date: Jan. 17, 2006

(87) PCT Pub. No.: WO03/050875

PCT Pub. Date: Jun. 19, 2003

(65) Prior Publication Data
US 2006/0177958 A1    Aug. 10, 2006

(30) Foreign Application Priority Data
Dec. 10, 2001    (FR) .................................... 01 15911

(51) Int. Cl.
G01R 31/26    (2006.01)
H01L 21/66    (2006.01)
(52) U.S. Cl. ...................... 438/14; 438/15; 250/370.08; 250/370.09; 250/370.14
(58) Field of Classification Search ............. 438/14–18; 250/370.08, 370.09, 370.14
See application file for complete search history.

(56) References Cited

U.S. PATENT DOCUMENTS

| 3,772,168 | A | * | 11/1973 | Dillenberg | ................... 205/253 |
| 3,968,360 | A | | 7/1976 | Monnier | |
| 4,341,954 | A | * | 7/1982 | Mizushima et al. | ......... 257/464 |
| 5,065,006 | A | | 11/1991 | Nakamura et al. | |
| 6,576,292 | B2 | * | 6/2003 | Zhuang et al. | ............... 427/250 |
| 6,649,274 | B1 | * | 11/2003 | Taenaka et al. | ............. 428/457 |

FOREIGN PATENT DOCUMENTS

EP    0 930 657 A1    7/1999

* cited by examiner

Primary Examiner—Hsien-ming Lee
(74) Attorney, Agent, or Firm—Nixon Peabody LLP

(57) ABSTRACT

The invention relates to a method for making an imagery device comprising at least one matrix of pixels made of a photon detecting semiconducting material (43), deposited on a substrate in which electronic devices are integrated and with metallic surfaces (42), in which a material capable of improving bond of the semiconducting material is deposited on the metallic surfaces (42) only of this substrate before the semiconducting material (43) is deposited on the said substrate.

20 Claims, 2 Drawing Sheets

METHOD FOR PRODUCING AN IMAGING DEVICE

CROSS-REFERENCE TO RELATED APPLICATION

This application claims priority based on International Patent Application No. PCT/FR02/04231, entitled "Method for Producing an Imaging Device" by Francois Mongellaz and Daniel Lincot, which claims priority of French Application No. 01/15911, filed on Dec. 10, 2001, and which was not published in English.

FIELD OF INVENTION

This invention relates to a method for making an imagery device.

BACKGROUND OF THE INVENTION

Document reference [1] mentioned at the end of the description describes a method for making an X-ray imagery device. As illustrated in FIG. 1, this imagery device comprises a matrix of pixels made of a semiconducting material, to convert incident X photons into electrical charges. This semiconducting material is deposited on a panel to read the electrical charges based on silicon 11, comprising several electronic devices each integrated into one pixel of the matrix 12.

This manufacturing method consists of a CSVT (Closed-Spaced Vapor Transport) transfer of the semiconducting material onto a silicon-based substrate integrating electronic devices.

As illustrated in FIG. 2, a source 21 comprising the semiconducting material 22, that may be solid or in powder form, is heated to a temperature T1 of the order of 600° C. The semiconducting material used as the source (CdTe, $PbI_2$, $HgI_2$) is close to substrate 23 (1 to 10 mm). The temperature of the substrate is regulated to a temperature T2 less than T1. It varies from 200° C. to 600° C. depending on the nature of the semiconducting material used and the required quality of the layer. The temperature gradient created enables material transport between the source 21 and the substrate 23. The physical properties of the semiconducting materials used associated with use of the CSVT method make it possible to impose a temperature (200° C. to 450° C.) compatible with the temperature resistance of electronic devices, on the substrate.

The dimensions of the X-ray imagery device thus obtained can vary from a few centimetres×a few centimeters up to 40 centimetres×40 centimeters. In particular, it may be used for medical imagery; it can operate in radiography mode or in radioscopy mode.

In one such device, the surface of the substrate on which the semiconducting material is deposited is heterogeneous. As illustrated in FIG. 3, the surface of this substrate 31 may be amorphous, recrystallised amorphous, polycrystalline or monocrystalline, and is composed of a passivation layer 32 ($SiO_x$ or SiN, or $SiO_x$+SiN) in which the openings leave the metallic surfaces 33 (aluminium or another metal) free, for pixellisation of each matrix. The semiconducting material must be in electrical contact with these metallic surfaces and be bonded to them.

Therefore, the semiconducting material is deposited on a surface comprising areas with different chemical compositions. The chemical affinity between the materials from which these zones are made and the semiconducting material to be deposited depends on deposition conditions. Obtaining a good chemical affinity, that guarantees good bond between the silicon substrate and the semiconducting material, imposes deposition conditions; temperatures T1 and T2, growth rate, temperature history, all have an influence on physical properties of the semiconducting material. The physical properties thus obtained are not necessarily compatible with the properties required for the detection of radiation.

Therefore, there is a bond problem between the surface of the silicon substrate and the semiconducting material.

The purpose of the invention is to solve this type of bond problem.

SUMMARY OF THE INVENTION

This invention relates to a method for making an imagery device comprising at least one matrix of pixels made of a photon detecting semiconducting material, deposited on a substrate in which electronic devices are integrated and with metallic surfaces, characterised in that a conducting material that improves bond of the semiconducting material is deposited on the metallic surfaces of this substrate before the semiconducting material is deposited on the said substrate.

The substrate may be made from a material chosen from among Si, GaAs, InP and compounds of these materials.

The semiconducting material may be chosen from among CdTe, Se, $PbI_2$, PbO, $HgI_2$, GaAs, TlBr, $BiI_3$ or $TlPbI_3$.

The material used to improve bond may be chosen from among Zn, Ti, Pt and Ni.

The substrate surface is a heterogeneous surface composed of a passivation layer, in which there are openings leaving metallic surfaces free. It may be made from a material chosen from among $SiO_x$, or SiN, or $SiO_x$+SiN. For example, the metallic surfaces may be made of aluminium, gold or copper.

Advantageously, the areas of the material deposited to improve bond are contiguous. The thickness of this material may be between a few Angstroms and a few micrometers.

In a first embodiment, the material to improve bond is deposited by chemical bath. Chemical bath deposition may be made by putting the metallic surface of this substrate into contact with a reactive solution containing the element to be deposited in dissolved form. In a first category of solutions, the element to be deposited reacts with the metal, dissolving it by oxidation, and being deposited to replace it. This element to be deposited is chosen from among Zn, Cd, Sn, Se, Cu, Te, Bi and In. In a second category of solutions, the element to be deposited is added in solution with an element capable of depositing it on the substrate. The elements to be deposited are chosen from among Ni, Sn, Cu, Au.

In a second embodiment, the material to improve bond is deposited by electrodeposition. This material is a metal, chosen from among Zn, Cu, Ni, Pb, Te, Se, Cd, Sn, Au, or a metal alloy or a non-metallic compound, for example such as an oxide or hydroxide, a metallic chalcogenide (Ms, Mse, Mte, where M is a metal).

The substrate acting as the first electrode is immersed in an adapted chemical solution containing elements to be deposited in ion form, a specific function of the substrate connecting all metallic surfaces to each other and bringing them all to the same potential. A second electrode is immersed in the solution, itself at a potential that depends on the electrolysis reaction. Passing a current between the two electrodes results in oxidation-reduction reactions, so that the compound that can improve bond is deposited on the surface of one of the electrodes.

In a third embodiment, the material is deposited in a vapour or gaseous phase or by atomisation. The substrate is placed in a frame so that it can be covered by a layer of material that can improve bond, this layer being arranged non-selectively and covering the entire surface of the substrate. This material is then selectively etched so as to leave material only on the metallic surfaces. The material can thus be etched by photolithography or laser ablation operations.

Thus, the method according to the invention uses a material that improves bond between metallic surfaces of the substrate and the semiconducting material. It then enables a deposit of the semiconducting layer on the substrate.

In one example embodiment, the method according to the invention is used to obtain an X-ray imagery device that includes at least one matrix of pixels to convert incident X photons into electric charges, particularly for the manufacture of read panels for an X imagery system in the medical domain.

DESCRIPTION OF THE INVENTION

Figure 1:
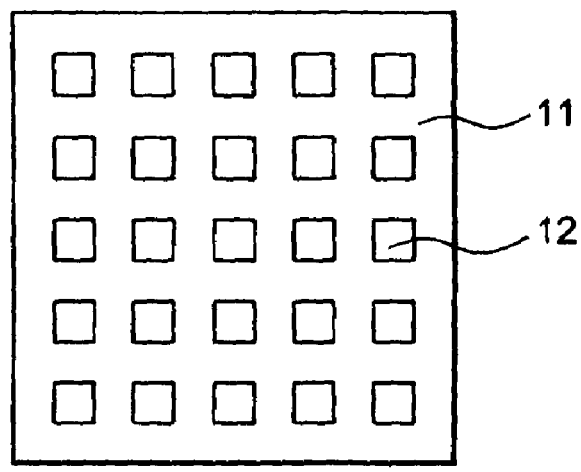
FIGS. 1 and 2 illustrate the operation of a method according to known art.
Figure 2:
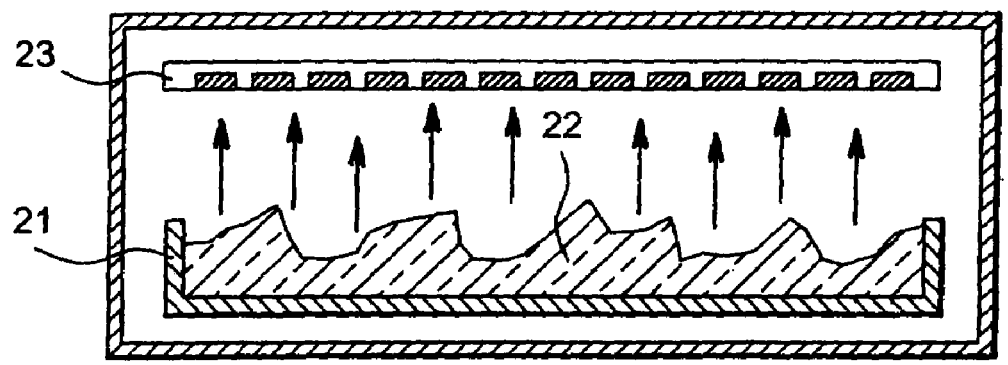
Figure 3:
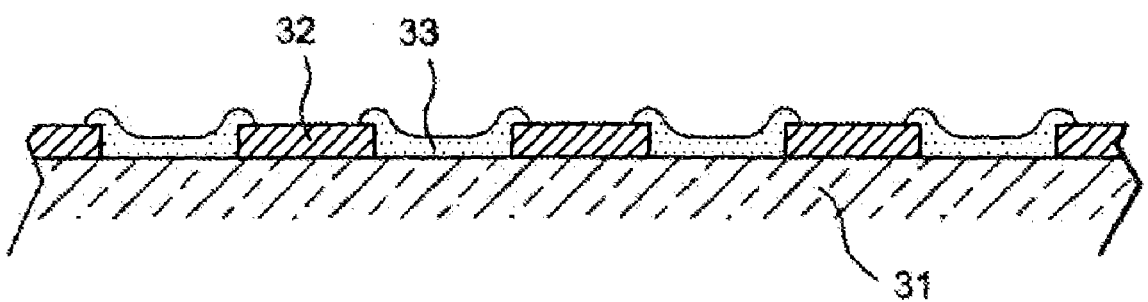
FIG. 3 illustrates a section through the surface of a read panel before deposition of the layer of semiconducting material.

In accordance with document reference [1], in the method according to the invention a matrix of pixels made of a photon detecting semiconducting material is made by depositing a layer of this material on a substrate integrating electronic devices and having metallic surfaces.

The process according to the invention solves the previously defined bond problem by depositing a material that can improve bond of the semiconducting material subsequently deposited on the metallic surfaces of the substrate, prior to the deposit of the semiconducting material on the substrate. The purpose of this material is to improve bond and electrical continuity between metallic surfaces of the substrate and the semiconducting layer and therefore between the semiconducting layer and the substrate.

The substrate may be made from a material chosen from among Si, GaAS, InP and components of these materials.

The layer of semiconducting material may be deposited by the CSVT method or the CSS (Close Space Sublimation) method, but also by vapour phase transfer methods with or without chemical agents, silkscreen printing or epitaxy in the liquid phase methods, to the extent that the temperature constraints defined above are respected.

The semiconducting material used can be chosen from among $CdTe$, $PbI_2$, $PbO$, $HgI_2$, $GaAs$, $Se$, $TlBr$, $BiT_3$, $TlPbI_3$.

The material capable of improving bond of the semiconducting material on the substrate will be chosen as a function of the pair of materials consisting of the read circuit material and the photon detector material for its crystalline and electrical characteristics. For example, it may be chosen from among Zn, Ti, Pt and Ni.

When it is planned to make the semiconducting material layer by epitaxy, the material capable of improving bond may be a homo-germ, in other words it is composed of the same chemical components as the layer of semiconducting material to be made. Therefore, the material acting as a homo-germ for growth of a CdTe layer is CdTe, it is $PbI_2$ for a $PbI_2$ layer, it is $HgI_2$ for a $HgI_2$ layer, and it is PbO for a PbO layer (similarly for GaAs, Se, $TlBr$, $BiI_3$, $TlPbI_3$).

Those skilled in the art would also tend to choose the material to improve bond such that its crystalline structure is different from the structure of the semiconducting layer. This type of choice can demonstrate that the material is present. Moreover, it could be expected that, due to its different crystalline structure, this material would act as a barrier for diffusion between the chemical elements forming the metallic surfaces and the layer of semiconducting material, the electrical properties of the layer of semiconducting material being very sensitive to the presence of doping agents, even in small quantities (or the order of a few ppb to a few ppm).

But the use of a germ material with the same crystalline structures, or "homo-germ" according to the invention, widens the range of growth conditions compatible with bond, since there is necessarily chemical affinity. The choice of growth conditions necessarily leads to the production of a semiconducting layer with the required physical properties.

This material capable of improving bond is deposited on metallic surfaces with a thickness of between a few Angstroms and a few micrometers.

Figure 4:
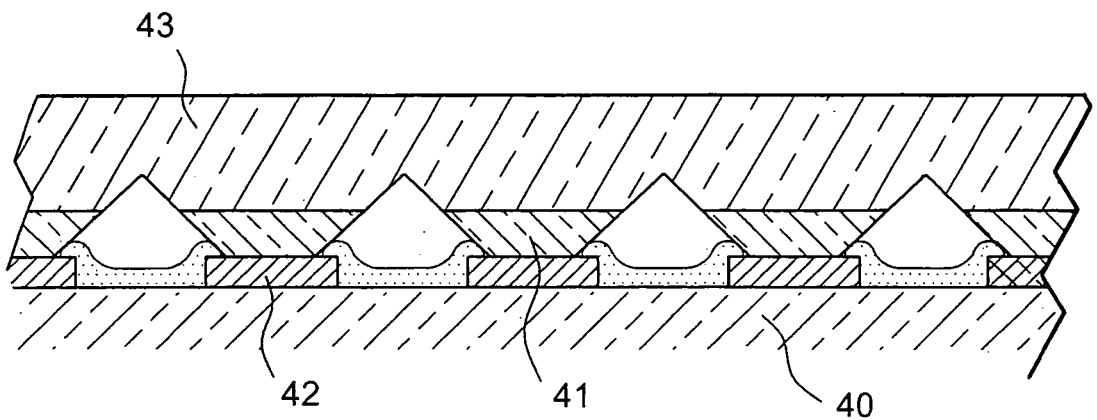
FIG. 4 illustrates the section through a read panel+non-contiguous bond areas+semiconducting layer assembly obtained with the method according to the invention.

As illustrated in FIG. 4, this material 41 must be present on the surface of the substrate 40, it must bond to the metallic surfaces 42 of the said substrate, it must provide electrical continuity with these metallic surfaces and it must enable bond of the semiconducting material 43. In FIG. 4, the areas 41 formed by this material deposited on the metallic surfaces are not contiguous.

Figure 5:
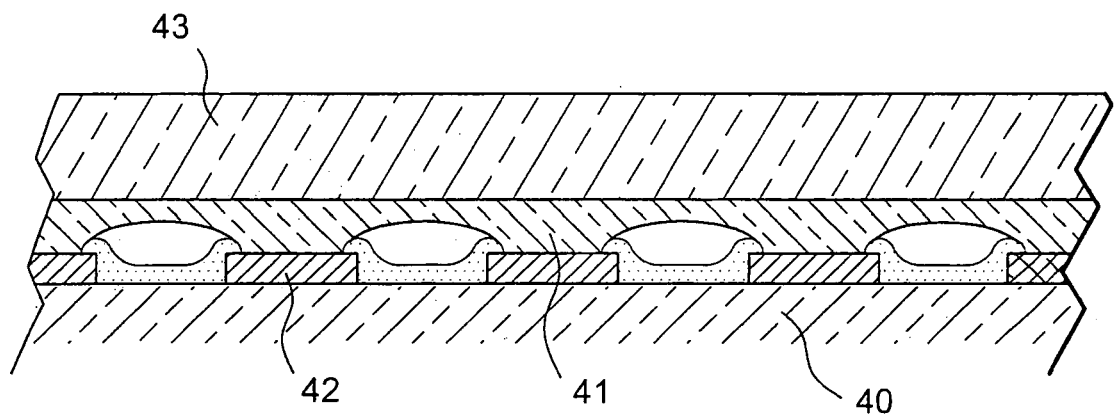
FIG. 5 illustrates the section through a read panel+contiguous bond areas+semiconducting layers assembly obtained with the method according to the invention.

But, as illustrated in FIG. 5, it would be useful if these areas are contiguous due to nucleation of the layer 43 of semiconducting material that is deposited on it.

The material capable of improving bond may be deposited using different methods, particularly a chemical bath, electro deposition as described in document reference [2], vapour or gaseous phase or atomisation.

This material may thus be deposited by chemical bath. This chemical bath deposition is made by putting the metallic surface of the substrate, for example made of aluminium, possibly but not necessarily pickled in advance, into contact with a reactive solution containing elements to be deposited in dissolved form, to reduce the thickness of the oxide layer.

In a first category of solutions, the element to be deposited reacts with metal, for example aluminium, dissolving it by oxidation and being deposited to replace it. This deposition method, called the displacement deposition method, is preferably used for metallic or non-metallic ions for which the reduction potential is higher than the oxidation potential of aluminium; these elements may be Zn, Cd, Pb, Sn, Se, Cu, Te, Bi, In, the preferred element being zinc.

In a second category of solutions, the element to be deposited is added into the solution with an element capable of selectively depositing it on the substrate, for example made of aluminium, that may or may not be previously covered by a first layer made using the previous method. In this case, the aluminium is not attacked and the integrity of the aluminium layer can be maintained. The elements to be deposited may be Ni, Sn, Cu, Au, etc. The preferred elements are Ni and Sn.

The chemically deposited layers may comprise several metallic or non-metallic elements, leading to these alloys or layers (oxides, hydroxides, chalcogenides, etc.).

Solutions making these reactions possible may be aqueous or non-aqueous.

Figure 6:
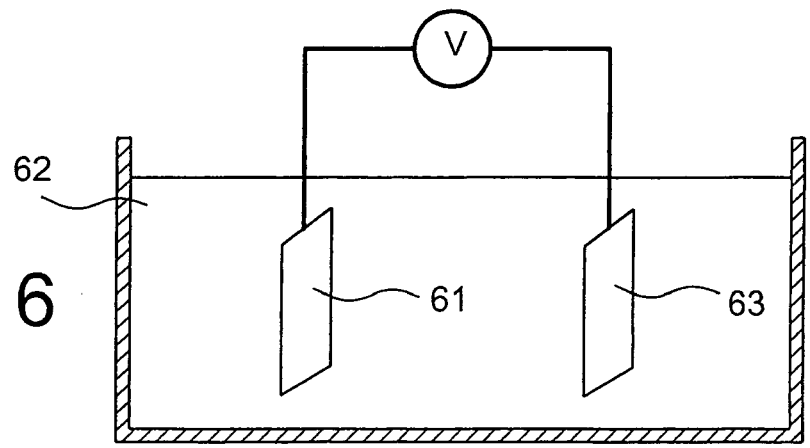
FIG. 6 illustrates operation of the electrolytic method that can be used in the process according to the invention.

This material may also be deposited by electro-deposition as illustrated in FIG. 6.

This material may be a metal chosen from Zn, Cu, Ni, Pb, Te, Se, Cd, Sn and Au, a metallic alloy or a non-metallic compound, for example such as an oxide or hydroxide, a metallic chalcogenide (MS, MSe, MTe, where M is a metal). The preferred materials are CdTe, CdSe, ZnTe, ZnSe, CdS, ZnS, PbSe, SnOx, SnSx, SnTex, SnSex, CuX, InX. Ternary alloys are also possible. This deposition may be made in an aqueous or a non-aqueous medium, preferably in an aqueous medium. This deposition may be made using galvanostatic or potentiostatic methods or any combination of these methods (voltametry, pulsed deposition).

As illustrated in FIG. 6, the substrate 61 (first electrode having a first potential) is immersed in an adapted chemical solution containing elements to be deposited in the form of ions 62 (electrolyte). A specific function of this substrate 61 connects all metallic surfaces together (short circuit) and puts them all at the same first potential. A second electrode 63 having a second potential is immersed in the solution, itself at a potential that depends on the electrolysis reaction. Passing a current between the two electrodes can result in oxidation-reduction reactions, and deposition of the required compound ($CdTe$, $HgI_2$, $PbI_2$, $BpO$, $Ga$, $As$, $Se$, $TlBr$, $BiI_3$, $TlPbI_3$) on the surface of an electrode. Since only the free areas of the metallic surfaces can carry current (therefore electron exchanges), only the polarised metallic surfaces are covered with the material deposited by electrolysis. In this case, the deposited areas are not contiguous. In other methods (bath, atomisation), the deposited areas may be contiguous. The substrate is introduced into a frame so that it can be covered by a layer of material capable of improving bond. This layer is deposited non-selectively and covers the entire surface of the substrate. The material may then be selectively etched in some cases, so as to leave only the material present on the metallic surfaces, for example by photolithography or laser ablation operations or by any other etching method.

REFERENCES

[1] FR-A-2 791 469
[2] "Electrochemistry of semiconductors and electronics. Processes and Devices" by John Mc Hardy and Franck Ludwig (Noyes Publications, 1992)

The invention claimed is:

1. A method for making an X-ray imagery device comprising at least one matrix of pixels to convert incident X photons into electrical charges, the method comprising:
   depositing a conducting material on a substrate having metallic surfaces; and
   depositing a layer of a photon detecting semiconducting material on the conducting material, wherein said conducting material being capable of improving bond between the photon detecting semiconducting material and the metallic surfaces of the substrate.

2. Method according to claim 1, in which the substrate is made from a material chosen from a group consisting of Si, GaAs, TnP and compounds of these materials.

3. Method according to claim 1, in which the photon detecting semiconducting material is chosen from a group consisting of CdTe, Se, $PbI_2$, PbO, $HgI_2$, GaAs, TlBr, $BiI_3$ and $TlPbI_3$.

4. Method according to claim 1, in which the conducting material being used to improve bond is chosen from a group consisting of Zn, Ti, Pt and Ni.

5. Method according to claim 1, in which a surface of the substrate is a heterogeneous surface composed of a passivation layer, in which there are openings leaving the metallic surfaces free.

6. Method according to claim 5, in which the passivation layer is made from a material chosen from a group consisting of SiO, SiN and SiO+SiN.

7. Method according to claim 5, in which the metallic surfaces are made of aluminium, gold or copper.

8. Method according to claim 1, in which areas formed by the conducting material deposited to improve bond are contiguous.

9. Method according to claim 1, in which a thickness of the conducting material to improve bond is between a few Angstroms and a few micrometers.

10. Method according to claim 1, in which the conducting material to improve bond is deposited by chemical bath.

11. Method according to claim 10, in which the metallic surfaces of the substrate is put into contact with a reactive solution containing an element to be deposited in dissolved form.

12. Method according to claim 11, in which the element to be deposited reacts with metal, dissolving it by oxidation, and being deposited to replace said metal.

13. Method according to claim 12, in which the element to be deposited is chosen from a group consisting of Zin, Cd, Sn, Se, Cu, Te, Bi and In.

14. Method according to claim 11, in which the element to be deposited is added in the reactive solution with an element capable of selectively depositing it on the substrate.

15. Method according to claim 14, in which the elements to be deposited are chosen from a group consisting of Ni, Sn, Cu and Au.

16. Method according claim 1, in which the conducting material to improve bond is deposited in a vapour or gaseous phase or by atomisation.

17. A method for making an imagery device comprising at least one matrix of pixels, the method comprising:
   depositing a conducting material on a substrate having metallic surfaces; and
   depositing a layer of a photon detecting semiconducting material on the conducting material, wherein said conducting material being capable of improving bond between the semiconducting material and the metallic surfaces of the substrate;
   wherein the conducting material to improve bond is deposited by electro-deposition, the conducting material being a metal selected from a group consisting of Zn, Cu, Ni, Pb, Te, Se, Cd, Sn, Au, or a metal alloy, or a metallic chalcogenide or a material selected from a group consisting of CdS, ZnS, SnOx, SnTex, and SnSex.

18. Method according to claim 17, in which the substrate acting as a first electrode is brought to a first potential and immersed in an adapted chemical solution containing elements to be deposited in ion form, in which metallic surfaces in contact with the substrate are connected to each other and brought to the same first potential, in which a second electrode is brought to a second potential that depends on an electrolysis reaction and immersed in the solution, and in which passing a current between the two electrodes results in oxidation-reduction reactions, so that the compound that can improve bond is deposited on a surface of one of the electrodes.

19. A method for making an imagery device comprising at least one matrix of pixels, the method comprising:
   depositing a conducting material on a substrate having metallic surfaces; and depositing a layer of a photon detecting semiconducting material on the conducting material, said conducting material being capable of improving bond between the semiconducting material and the metallic surfaces of the substrate;

wherein the substrate is placed in frame so that it can be covered by said conducting material said conducting material being arranged non-selectively and covering an entire surface of the substrate, and in which said conducting material is then selectively etched so as to remain only above the metallic surfaces.

20. A method for making an imagery device comprising at least one matrix of pixels, the method comprising:

depositing a conducting material on a substrate having metallic surfaces; and depositing a layer of a photon detecting semiconducting material on the conducting material, said conducting material being capable of improving bond between the semiconducting material and the metallic surfaces of the substrate;

wherein the conducting material for improving bond is identical to the semiconducting material and forms a homogerm in which the photon detecting semiconducting material is obtained by crystalline growth starting from the homogerm.

* * * * *